US011502094B2

United States Patent
Zhang et al.

(10) Patent No.: US 11,502,094 B2
(45) Date of Patent: Nov. 15, 2022

(54) MULTI-LEVEL VERTICAL MEMORY DEVICE INCLUDING INTER-LEVEL CHANNEL CONNECTOR

(71) Applicant: YANGTZE MEMORY TECHNOLOGIES CO., LTD., Wuhan (CN)

(72) Inventors: Ruo Fang Zhang, Wuhan (CN); Enbo Wang, Wuhan (CN); Haohao Yang, Wuhan (CN); Qianbing Xu, Wuhan (CN); Yushi Hu, Wuhan (CN); Qian Tao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 479 days.

(21) Appl. No.: 16/367,305

(22) Filed: Mar. 28, 2019

(65) Prior Publication Data
US 2020/0105778 A1    Apr. 2, 2020

Related U.S. Application Data

(63) Continuation of application No. PCT/CN2018/107922, filed on Sep. 27, 2018.

(51) Int. Cl.
H01L 27/11556    (2017.01)
H01L 27/11524    (2017.01)

(52) U.S. Cl.
CPC .. *H01L 27/11556* (2013.01); *H01L 27/11524* (2013.01)

(58) Field of Classification Search
CPC ................................................ H01L 27/11556
See application file for complete search history.

(56) References Cited

U.S. PATENT DOCUMENTS

| 8,492,831 | B2 | 7/2013 | Hwang et al. |
| 9,672,917 | B1 | 6/2017 | Costa et al. |

(Continued)

FOREIGN PATENT DOCUMENTS

| CN | 106653684 A | 5/2017 |
| CN | 108538848 A | 9/2018 |

(Continued)

OTHER PUBLICATIONS

Combined Chinese Office Action and Search Report dated Dec. 12, 2019 in Patent Application No. 201880001908.0 (with English translation of Categories of Cited Documents), 5 pages.

(Continued)

*Primary Examiner* — Matthew C Landau
*Assistant Examiner* — Mark Hatzilambrou
(74) *Attorney, Agent, or Firm* — Oblon, McClelland, Maier & Neustadt, L.L.P.

(57) ABSTRACT

A semiconductor device includes a string of transistors stacked along a vertical direction above a substrate of the semiconductor device. The string can include a first substring, a channel connector disposed above the first substring, and a second substring. The first substring includes a first channel structure having a first channel layer and a first gate dielectric structure that extend along the vertical direction. The second substring is stacked above the channel connector, and has a second channel structure that includes a second channel layer and a second gate dielectric structure that extend along the vertical direction. The channel connector, electrically coupling the first and the second channel layer, is disposed below the second gate dielectric structure to enable formation of a conductive path in a bottom region of the second channel layer. The bottom region is associated with a lowermost transistor in the second substring.

13 Claims, 14 Drawing Sheets

(56) References Cited

U.S. PATENT DOCUMENTS

| | | | |
|---|---|---|---|
| 9,711,188 B2 | 7/2017 | Hwang et al. | |
| 9,966,155 B2 | 5/2018 | Hwang et al. | |
| 10,224,104 B2 | 3/2019 | Chowdhury et al. | |
| 2011/0018036 A1 | 1/2011 | Hwang et al. | |
| 2012/0112264 A1* | 5/2012 | Lee | H01L 29/7926 257/324 |
| 2013/0279233 A1 | 10/2013 | Hwang et al. | |
| 2016/0005760 A1* | 1/2016 | Lee | H01L 29/1033 257/324 |
| 2016/0247547 A1 | 8/2016 | Hwang et al. | |
| 2017/0062471 A1 | 3/2017 | Son et al. | |
| 2017/0148731 A1 | 5/2017 | Saino | |
| 2017/0236559 A1 | 8/2017 | Hwang et al. | |
| 2017/0278571 A1 | 9/2017 | Chowdhury et al. | |
| 2018/0182771 A1 | 6/2018 | Costa et al. | |

FOREIGN PATENT DOCUMENTS

| | | |
|---|---|---|
| CN | 108565266 A | 9/2018 |
| KR | 10-2018-0104250 A | 9/2018 |
| WO | WO 2018/161846 A1 | 9/2018 |

OTHER PUBLICATIONS

Combined Chinese Office Action and Search Report dated Sep. 24, 2019 in Patent Application No. 201880001908.0 (with English translation of Categories of Cited Documents), 9 pages.

Combined Chinese Office Action and Search Report dated Oct. 20, 2020 in Chinese Patent Application No. 202010114927.3 (with English translation of Category of Cited Documents), 6 pages.

International Search Report and Written Opinion dated Jun. 27, 2019 in PCT/CN2018/107922, 9 pages.

Chinese Office Action dated Jul. 18, 2019, in Patent Application No. 201880001908.0, 6 pages.

Extended European Search Report dated Jan. 24, 2022 in corresponding European Patent Application No. 18934860.0, 9 pages.

* cited by examiner

MULTI-LEVEL VERTICAL MEMORY DEVICE INCLUDING INTER-LEVEL CHANNEL CONNECTOR

RELATED APPLICATION

This application is a bypass continuation of International Application No. PCT/CN2018/107922, filed on Sep. 27, 2018. The entire disclosure of the prior application is hereby incorporated by reference in its entirety.

BACKGROUND

As critical dimensions of devices in integrated circuits shrink to the limits of common memory cell technologies, techniques are developed to achieve greater storage capacity. Compared to a planar transistor structure, a vertical structure of the 3D NAND memory devices is involved with more complex manufacturing processes. As the 3D NAND memory devices migrates to configurations with more memory cell layers to achieve higher densities at a lower cost per bit, it becomes an increasing challenge to improve structures and methods for manufacturing the same.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

SUMMARY

Figure 1:
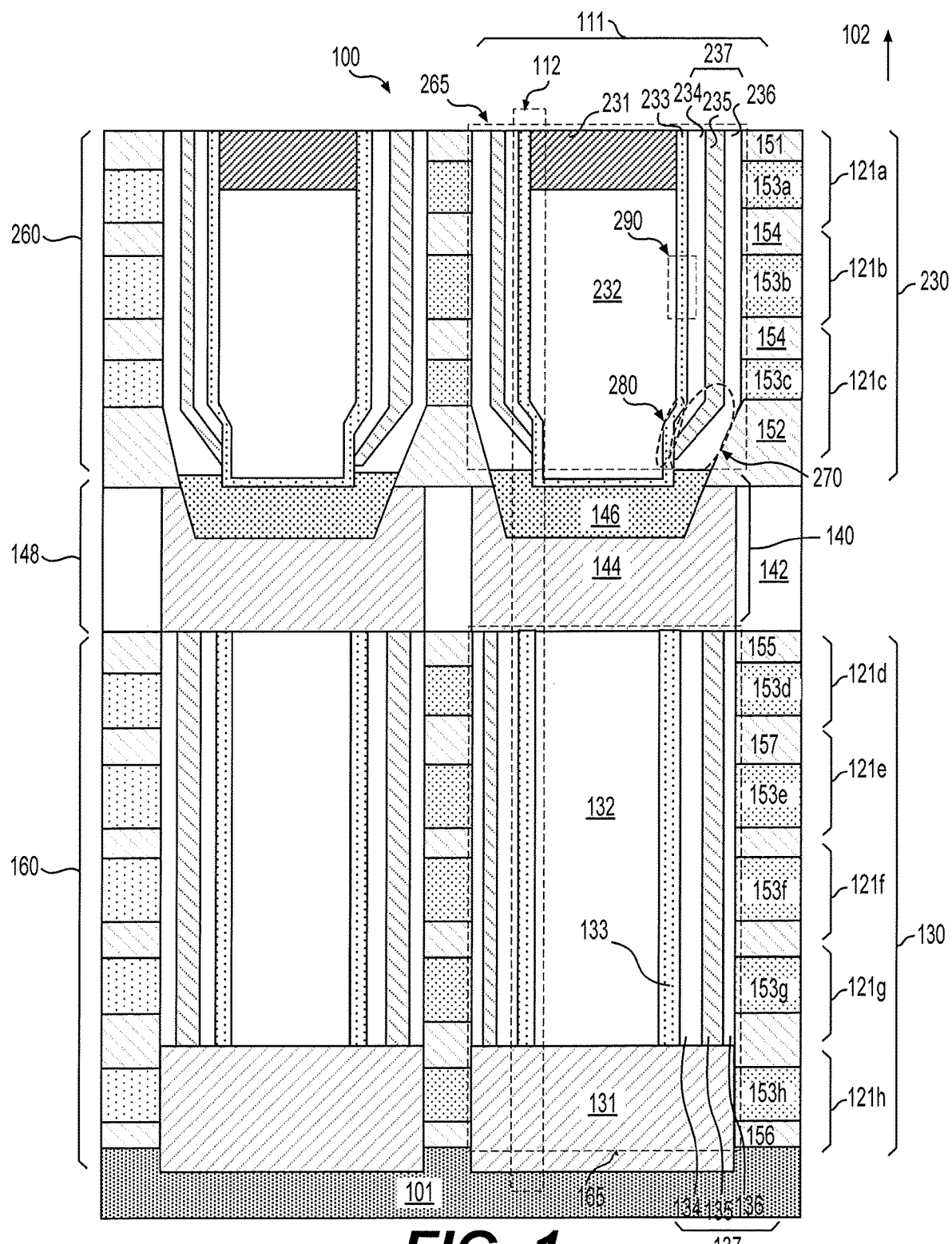
FIG. 1 shows a cross-section view of a portion of a semiconductor device 100 in accordance with some embodiments of the disclosure.

According to aspects of the disclosure, a semiconductor device including a string of transistors stacked along a vertical direction above a substrate of the semiconductor device is provided. The string includes a first substring of transistors having a first channel structure that includes a first channel layer and a first gate dielectric structure that extend along the vertical direction. The string also includes a channel connector disposed above the first substring, and a second substring of transistors stacked above the channel connector. The second substring has a second channel structure that includes a second channel layer and a second gate dielectric structure that extend along the vertical direction. The channel connector electrically couples the first channel layer and the second channel layer and is disposed below the second gate dielectric structure.

In some embodiments, the channel connector includes a first structure and a second structure, the first structure includes a recessed region that is overfilled by the second structure, the first structure is separated from the second gate dielectric structure, and the second structure is disposed adjacent to and below the second gate dielectric structure. In some examples, the first structure is adjacent to the first channel layer, the second structure is adjacent to the second channel layer, and a channel layer of the string includes the first channel layer and the second channel layer electrically coupled by the channel connector.

In an example, the second gate dielectric structure includes a tunnel insulating layer, a charge storage layer, and a blocking insulating layer that are sequentially formed over the second channel layer.

In some embodiments, the channel connector includes a first structure and a second structure. The first structure is in contact with the first channel layer and has a first upper surface with a first recess. The second structure is in contact with the second channel layer and has a second upper surface with a second recess. The second gate dielectric structure is disposed on the second upper surface, and the second upper surface is above the first upper surface. The second structure is disposed in the first recess, and the second channel layer is disposed in the second recess.

In some embodiments, the channel connector includes a recess formed in an upper surface of the channel connector, the second gate dielectric structure is disposed on the upper surface, and the second channel layer is formed in the recess.

In some embodiments, the channel connector comprises a second structure disposed on a first structure, the second structure is in contact with the second channel structure, and the second structure is formed of an epitaxially grown material.

In an example, the channel connector includes polysilicon.

Aspects of the disclosure provide a method for manufacturing a string of transistors in a semiconductor device over a substrate of the semiconductor device. The method includes forming a first substring of transistors having a first channel structure that includes a first channel layer and a first gate dielectric structure that extend along a vertical direction over the substrate, forming a channel connector over the first substring, and forming a second substring of transistors above the channel connector. The second substring has a second channel structure that includes a second channel layer and a second gate dielectric structure that extend along the vertical direction. The channel connector electrically couples the first channel layer and the second channel layer, and is disposed below the second gate dielectric structure.

Aspects of the disclosure provide a semiconductor memory device. The semiconductor memory device includes a first deck of memory cells including a plurality of first substrings of memory cells over a substrate of the semiconductor memory device. The first substrings have respective first channel structures that include first channel layers and first gate dielectric structures that extend along a vertical direction above the substrate. The semiconductor memory device includes an inter-deck structure including a plurality of channel connectors. The channel connectors are disposed above the respective first substrings. The semiconductor memory device includes a second deck of memory cells including a plurality of second substrings of memory cells. The second substrings are stacked above the respective channel connectors and have respective second channel structures that include second channel layers and second gate dielectric structures that extend along the vertical direction. The channel connectors electrically couple the respective first channel layers and the second channel layers, and are disposed below the respective second gate dielectric structures.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a cross-section view of a portion of a semiconductor device 100 in accordance with some embodiments of the disclosure. The semiconductor device 100 includes a plurality of strings 111 over a substrate 101. In some embodiments, each string 111 includes multiple transistors 121a-121g stacked along a direction 102 to increase a transistor density, i.e., a number of transistors per unit area. As the transistor density further increases, the string 111 can include multiple substrings connected by channel connectors, for example, to facilitate manufacturing of the string 111.

In an embodiment, the string 111 includes a first substring 130 and a second substring 230 connected by the channel connector 140. The first substring 130 includes a first channel structure 165 extending along the direction 102 and first gate structures 153d-153h disposed adjacent to the first channel structure 165. The first channel structure 165 further includes a first channel layer 133 and a first gate dielectric structure 137 that extend along the direction 102. The channel connector 140 is stacked above the first substring 130.

In an embodiment, the second substring 230 is stacked above the channel connector 140 and the first substring 130. The second substring 230 includes a second channel structure 265 extending along the direction 102 and second gate structures 153a-153c disposed adjacent to the second channel structure 265. The second channel structure 265 further includes a second channel layer 233 and a second gate dielectric structure 237 that extend along the direction 102. The second gate dielectric structure 237 isolates the second channel layer 233 from the second gate structures 153a-153c.

Referring to FIG. 1, the channel connector 140 between the first substring 130 and the second substring 230 electrically couples the first and second channel layer 133 and 233 to form a channel layer 112 of the string 111. According to aspects of the disclosure, the channel connector 140 is disposed below the second gate dielectric structure 237 that includes a bottom portion, referred to as dielectric portion 270. Note that the dielectric portion 270 is associated with the transistor 121c, a lowermost transistor in the second substring 230. Accordingly, a conductive path having relatively low resistance can be formed in a channel region 280 adjacent to the dielectric portion 270 when a suitable voltage is applied to the second gate structure 153c of the transistor 121c. In an example, the channel region 280 is a lowermost portion of the second channel layer 233, and is disposed above the channel connector 140. Note that a conductive path having relatively low resistance can form in the channel layer 112 including the first channel layer 133, the channel connector 140, and the second channel layer 233 when suitable voltages are applied to the first and second gate structures 153a-153h, respectively.

In an embodiment, the semiconductor device 100 is a nonvolatile memory device, such as a three-dimensional (3D) NAND flash memory device where the transistors 121a-121g are stacked along the direction 102 to increase a storage density. In an example, the direction 102 is perpendicular to a working surface of the substrate 101.

In some examples, the transistors 121b-121g are used as memory cells 121b-121g to store data. The string 111 can also include a first selection transistor 121a and a second selection structure 121h that are connected in series with the memory cells 121b-121g. In general, to access individual transistors that store data in a memory device, additional circuits are formed as described below. A bit line (not shown) can be connected to one side of the string 111, for example, via a second contact 231 associated with the first selection transistor 121a. A source line (not shown) can be connected to another side of the string 111, for example, via a first contact 131 associated with the second selection structure 121h. The first selection transistor 121a can be disposed between the bit line and the uppermost memory cell 121b. The second selection structure 121h can be disposed between the lowermost memory cell 121g and the source line. In some examples, multiple memory cells in a same layer can be controlled by a word line (not shown) connected to respective gate structures. For example, the memory cells 121b can be controlled by a first word line connected to the second gate structure 153b, the memory cells 121c can be controlled by a second word line, and the like.

In some embodiments, such as shown in FIG. 1, the first gate structure 153h is a bottom select gate. In some examples, the first contact 131 is separated from the first gate structure 153h by a dielectric layer (not shown in FIG. 1). The first contact 131 further extends into the substrate 101. In some embodiments, a top surface of the first contact 131 is above a top surface of the first gate structure 153h and below a bottom surface of the first gate structure 153g. For example, the top surface of the first contact 131 is located at a middle positon between the top surface of the first gate structure 153h and the bottom surface of the first gate structure 153g.

In various examples, data, such as a bit value '0' or a bit value '1', is stored in a memory cell as different levels of electric charges. Data can be written into, erased from, and read from a memory cell by applying suitable voltages to the respective word lines, first select lines connected to the gate structures 153a, second select lines connected to the gate structures 153h, the bit lines, the source lines, and the like. In an embodiment, data in a memory cell, such as the memory cell 121b, can be read by measuring a level of a current in a channel region 290 in the memory cell 121b when a measurement voltage is applied to the second gate structure 153b and other suitable voltages are applied to other gate structures 153a and 153c-153h. In order for the level of the current in the channel layer 112 to reflect the data in the memory cell 121b and minimize effects caused by other portions of the channel layer 112, resistance of the other portions of the channel layer 112 can be optimized, for example, to be substantially less than a resistance of the channel region 290. According to aspects of the disclosure, the second gate dielectric structure 237 including the dielectric portion 270 is disposed above the channel connector 140. When a suitable voltage is applied to the second gate structure 153c, a conductive path with relatively small resistance is formed in the channel portion 280.

The first channel structure 165 can have any suitable shape, dimension, and materials. Multiple first channel structures 165 can be separately disposed from each other over the substrate 101 to form the multiple strings 111. For example, FIG. 1 shows two first channel structures 165 of two respective strings 111. In an example, the first channel structure 165 has a pillar or cylindrical shape extending in the direction 102.

As described above, each first channel structure 165 includes the first channel layer 133 that can have any suitable shape, dimension, and materials. In an example, the first channel layer 133 has a hollow cylindrical shape that extends in the direction 102. The first channel layer 133 can include one or more semiconductor materials. The one or more semiconductor materials can be intrinsic, p-type doped, n-type doped, and the like. In an example, the first channel layer 133 includes polysilicon. In the example shown in FIG. 1, a first insulating layer 132 fills a space surrounded by the first channel layer 133.

The first gate dielectric structure 137 is disposed between the first channel layer 133 and the first gate structures 153d-153h. The first gate dielectric structure 137 can extend in the direction 102.

The first gate structures 153d-153h, separated by insulating layers 157, are formed adjacent to the first gate dielectric structure 137. An upper insulating layer 155 is formed above the first gate structure 153d. In an example, a lower insulating layer 156 is formed between the first gate structure 153h and the substrate 101. In various examples, the first gate structures 153d-153h include conductive materials, such as metals. In some examples, the first gate structures 153d-153h include a layer having high dielectric constant (high-K) material, referred to as a high-K layer, and a metal layer, such as tungsten (W). Thicknesses of the first gate structures 153d-153h can range from 20 to 50 nm, such as 35 nm.

The insulating layers 155-157 can electrically isolate the first gate structures 153d-153h from each other and other structures in the semiconductor device 100. The insulating layers 155-157 can include any suitable insulating materials, such as silicon oxide. The insulating layers 155-157 can have any suitable thicknesses, such as between 20 and 40 nm. The first channel layer 133, the first gate dielectric structure 137, and the first gate structures 153d-153g form the respective transistors 121d-121g. In general, operations of the transistors 121d-121g are controlled by applying suitable voltages to the respective first gate structures 153d-153g.

In some embodiments, the first gate dielectric structure 137 includes multiple dielectric layers, such as a tunnel insulating layer 134, a charge storage layer 135, and a blocking insulating layer 136 that are sequentially stacked over the first channel layer 133. Accordingly, the memory cells 121d-121g can be floating-gate transistors where electric charges from the first channel layer 133 can be transferred into the charge storage layer 135 via a quantum tunneling process through the tunneling insulating layer 134.

The charge storage layer 135, also referred to as a floating gate, can store data, e.g., the electric charges. In some embodiments (not shown in FIG. 1), the structure 121h has similar or identical structure, dimension, and materials to those of the memory cells 121d-121g, however, the structure 121h can be operated as a second selection transistor instead of a memory cell. In some embodiments, such as shown in FIG. 1, the second selection structure 121h has different structure and materials from those of the memory cells 121d-121g.

In general, the first channel layer 133 can be electrically connected to the first contact 131, and the first contact 131 can be electrically coupled to the substrate 101. The first contact 131 can include silicon (Si), such as monocrystalline Si. A plurality of first substrings 130 is referred to as a first deck 160. In some examples, such as shown in FIG. 1, the first strings 111 in the first deck 160 have identical or similar structures, dimensions, and materials. In some examples, a first string in the first deck 160 can be different from another first string in the first deck 160.

The channel connector 140 can be formed, for example, with polysilicon over the respective first substring 130. In an example, the channel connector 140 includes two structures, a first structure 144 and a second structure 146 that is inserted into the first structure 144. The first structure 144 and the second structure 146 can include one or more semiconductor materials, such as polysilicon. The first structures 144 are electrically isolated from each other by an insulating layer 142. The insulating layer 142 can include silicon oxide, silicon oxynitride, silicon nitride, and the like. A plurality of channel connectors 140 isolated by the insulating layer 142 forms an inter-deck structure 148.

Each second substring 230 can be formed over the respective channel connector 140. According to aspects of the disclosure, the second gate dielectric structure 237 is disposed above the channel connector 140, thus, above the first structure 144 and the second structure 146. The second channel structure 265 can have any suitable shape, dimension, and materials. In an example, the second channel structure 265 has a pillar or cylindrical shape extending in the direction 102.

The second channel structure 265 includes the second channel layer 233 that can have any suitable shape, dimension, and materials that extends in the direction 102. In an example, a portion of the second channel layer 233 has a hollow cylindrical shape, as shown in FIG. 1. Similarly, the second channel layer 233 can include one or more semiconductor materials. The one or more semiconductor materials can be intrinsic, p-type doped, n-type doped, and the like. In an example, second channel layer 233 includes polysilicon. In some examples as shown in FIG. 1, a second insulating layer 232 fills a space surrounded by the second channel layer 233.

The second gate dielectric structure 237 is disposed between the second channel layer 233 and the second gate structures 153a-153c. The second gate dielectric structure 237 can extend in the direction 102.

The second gate structures 153a-153c, separated by insulating layers 154, are formed adjacent to the second gate dielectric structure 237. An upper insulating layer 151 is formed above the second gate structure 153a, and a lower insulating layer 152 is formed below the second gate structure 153c The second gate structures 153a-153c can have similar structures and materials to those of the first gate structures 153d-153h, thus the description is omitted for purposes of clarity. The insulating layers 151, 152, and 154 can electrically isolate the second gate structures 153a-153c from each other and other structures in the semiconductor device 100.

The second channel layer 233, the second gate dielectric structure 237, and the second gate structures 153a-153c form the respective transistors 121a-121c. Similarly, operations of the transistors 121a-121c are controlled by applying suitable voltages to the respective second gate structures 153a-153c.

In some embodiments, the second gate dielectric structure 237 includes multiple dielectric layers, such as a tunnel insulating layer 234, a charge storage layer 235, and a blocking insulating layer 236 that are sequentially stacked over the second channel layer 233. Accordingly, the memory cells 121b-121c can be floating-gate transistors, similarly to 151d-151g as described above. In some embodiments, the transistor 121a has similar or identical structure, dimension, and materials to those of the memory cells 121b-121c, however, the transistor 121a can be operated as the second selection transistor instead of a memory cell.

In an example, the second channel layer 233 can be electrically connected to the bit line via the second contact 231 made of, for example, polysilicon. A plurality of second substrings 230 is referred to as a second deck 260. In some examples, such as shown in FIG. 1, the second substrings 230 in the second deck 260 have identical or similar structures, dimensions, and materials. In some examples, a second substring in the second deck 260 can be different from another second substring in the second deck 260, for example, in structure, dimensions, and materials.

The gate structures 153a-153h can have any suitable thicknesses according to desired characteristics of the transistors and the second selection structure 121a-121h. For example, the thicknesses of the gate structures 153a-153h can be equal to one another or be different from one another. Similarly, the insulating layers 151, 152, 154-157 can have any suitable thicknesses according to desired characteristics of the transistors and the second selection structure 121a-121h.

In addition to the first selection transistor 121a, one or more additional transistors can be disposed above the transistor 121a and used as the first selection transistors in the string 111. Similarly, in addition to the second selection structure 121h, one or more additional selection structures can be disposed below the transistor 153g and used as the second selection transistors in the string 111. In some embodiments, the first selection transistors and the second selection structures can have a structure similar or identical to that of the memory cells. In some embodiments, the first selection transistors and the second selection structures can have a structure different from that of the memory cells. For example, a portion of the second gate dielectric structure 237 corresponding to the first selection transistor 121a includes a blocking insulating layer while portions of the second gate dielectric structure 237 corresponding to the transistors 121b-121c includes the multiple dielectric layers, such as the tunnel insulating layer 234, the charge storage layer 235, and the blocking insulating layer 236.

Note that any suitable number of memory cells can be formed in each substring, depending on a capacity of the semiconductor device 100. As an example, the number of memory cells in a substring is 32, 64, and the like.

FIG. 1 shows an example where the string 111 includes two substrings, i.e., the first substring 130 and the second substring 230. In some embodiments, more than two substrings can be included in a string, and the string 111 described above can be suitably adapted to include one or more additional strings. For example, the second contact 231 can be excluded from the second substring 230, and a third substring can be stacked above and separated from the second substring 230 via another channel connector. The third substring and the other channel connector can have identical or similar structures, dimensions, and the materials to the second substring 230 and the channel connector 140, respectively. In an example, the first substring 130 can be suitably adapted, and an additional substring can be added between the first substring 130 and the substrate 101. Further, the additional substring can be connected to the first substring 130 via an additional channel connector.

Figure 12:
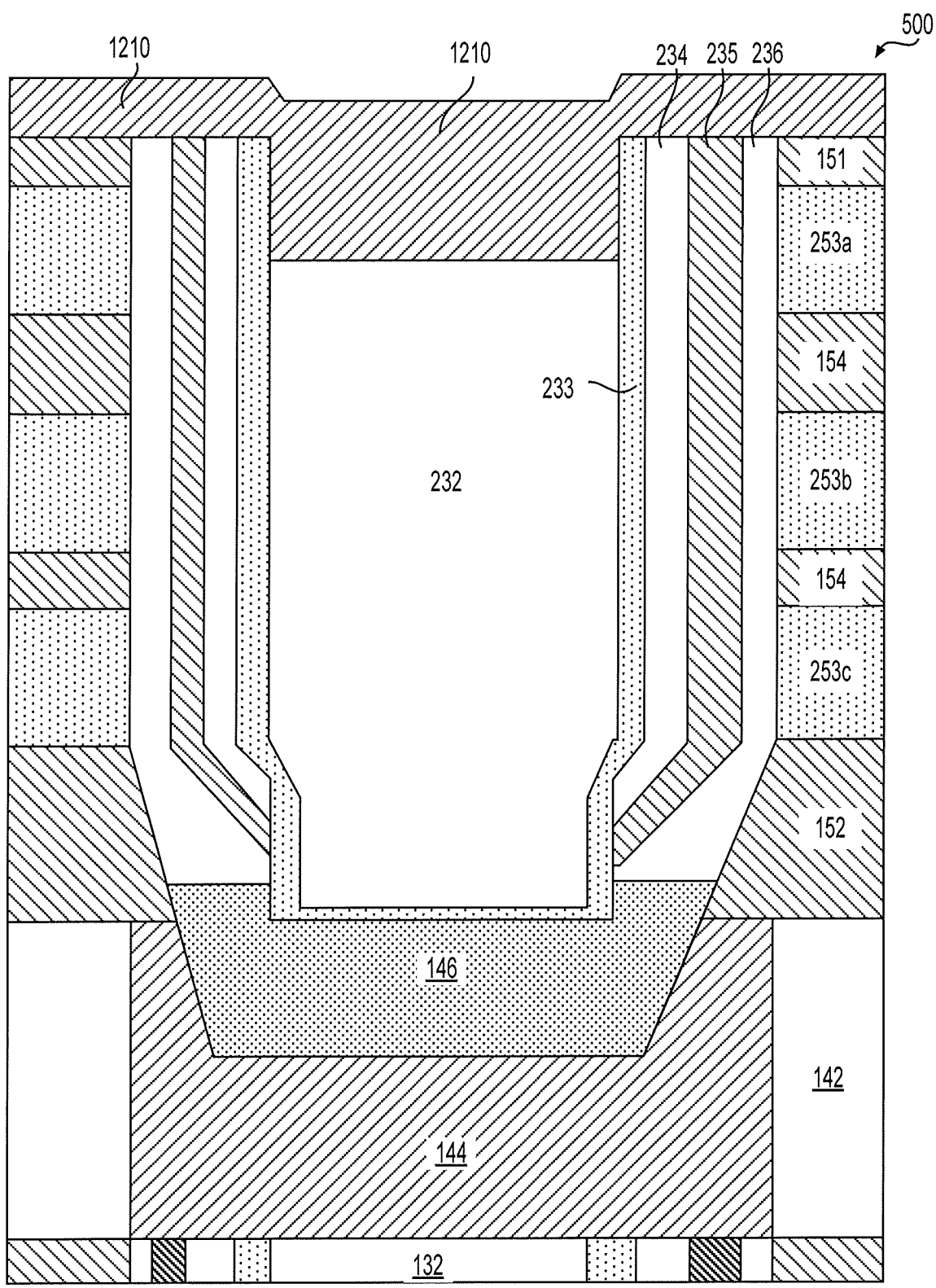
Figure 13:
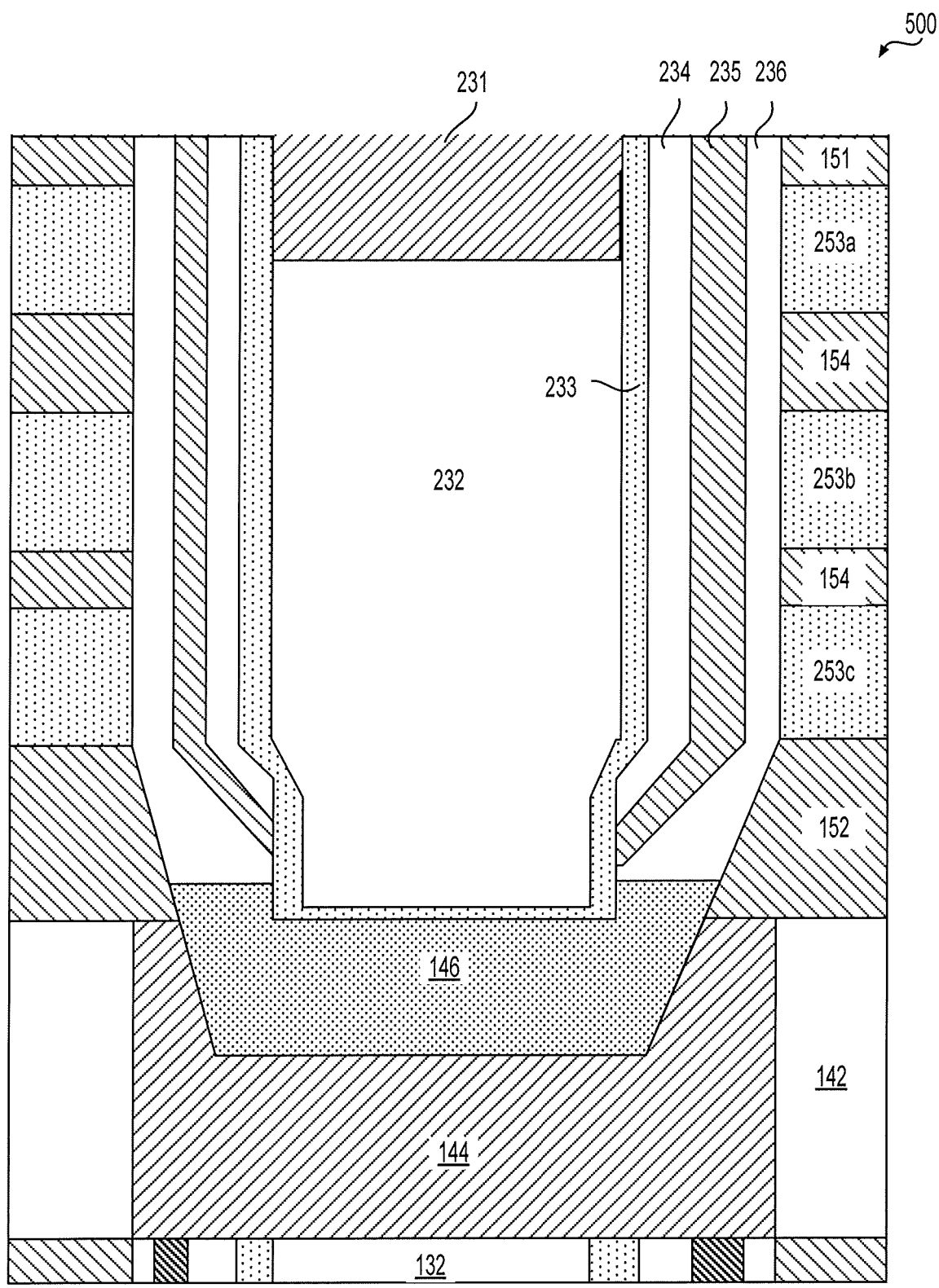
Figure 14:
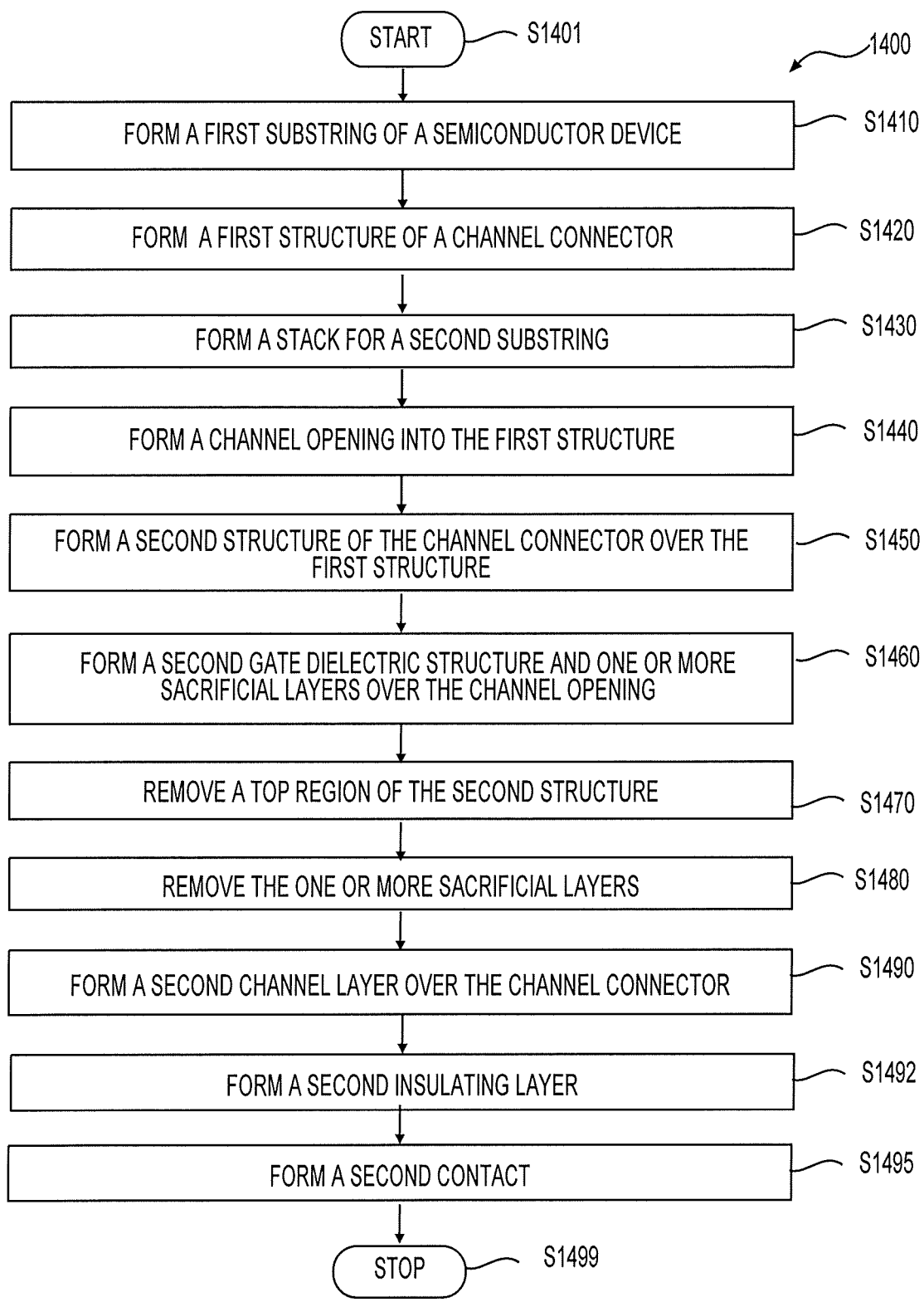
FIG. 14 shows a flow chart outlining the process 1400 for semiconductor fabrication according to an embodiment of the disclosure.

FIGS. 2-13 are cross-sectional views of the portion of the semiconductor device 100 at various steps of a process 1400 according to some embodiments of the disclosure. FIG. 14 shows a flow chart outlining the process 1400 for semiconductor fabrication according to an embodiment of the disclosure. The process 1400 is used to fabricate the strings 111 in the semiconductor device 100 shown in FIG. 1. As used herein, a semiconductor device can include one or more transistors (e.g., field-effect transistors and floating-gate transistors), integrated circuits, a semiconductor chip (e.g., memory chip including a 3D NAND memory device, a logic chip on a semiconductor die), a stack of semiconductor chips, a semiconductor package, a semiconductor wafer, and the like.

It is also noted that the process 1400 can be combined with other process flows to manufacture other suitable semiconductor components (not shown), such as other types of transistors, bipolar junction transistors, resistors, capacitors, inductors, diodes, fuses, and the like on the semiconductor device 100. In various embodiments, the process 1400 can also be combined with additional process flows to manufacture other suitable circuits, for example, a peripheral circuit for driving the memory cells, a sense amplifier for reading data stored in the memory cells, a decoding circuit, and the like. The steps of the process 1400, including any descriptions given with reference to FIGS. 2-14, are merely exemplary and are not intended to be limiting.

Figure 2:
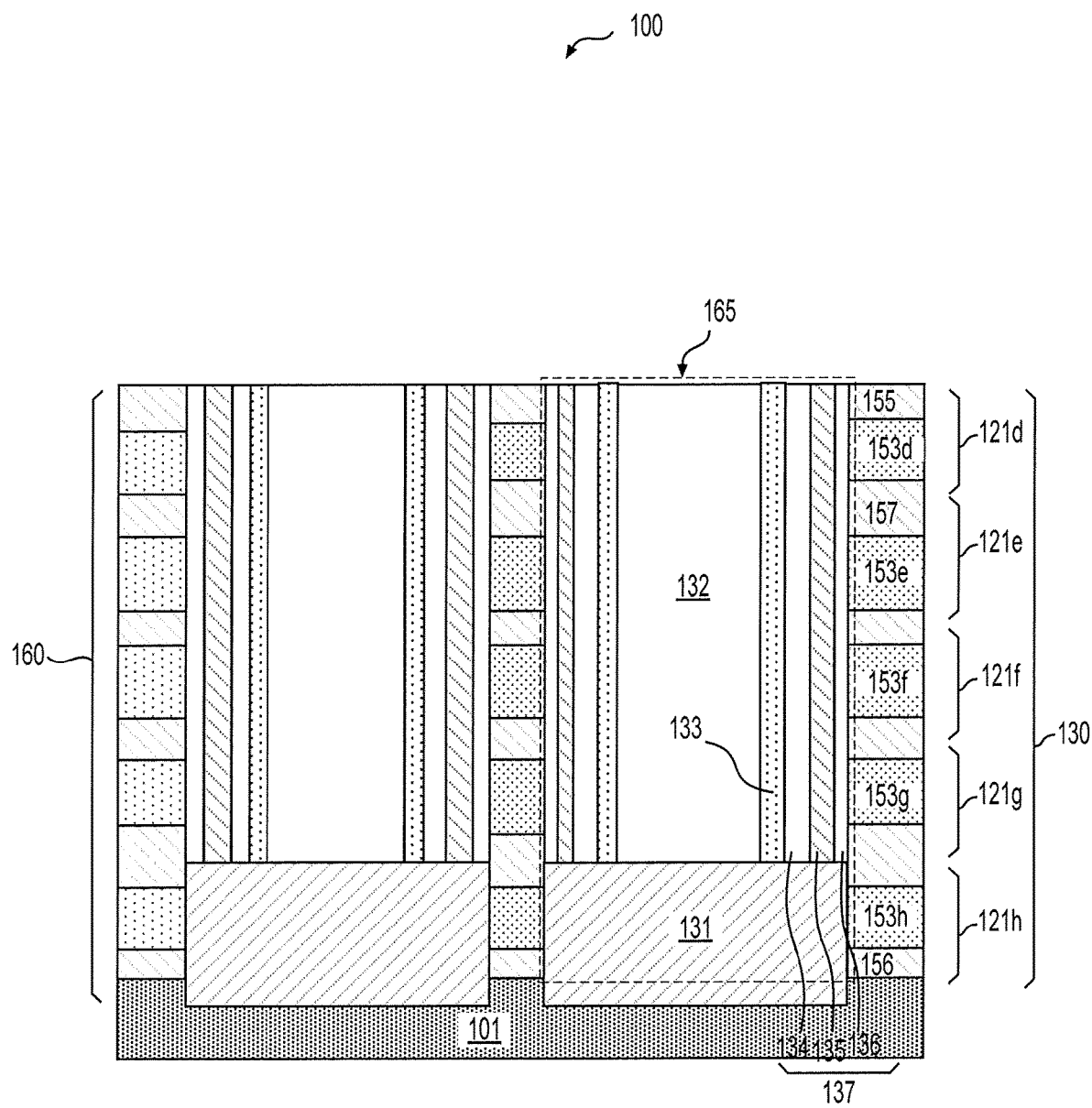
FIGS. 2-13 are cross-sectional views of the portion of the semiconductor device 100 at various steps of a process 1400 according to some embodiments of the disclosure.

Referring to FIGS. 2 and 14, the process 1400 starts at S1401, and proceeds to S1410. At S1410, the first substring 130 of the semiconductor device 100 is formed over the substrate 101. In an example, a plurality of the first substrings 130 is fabricated to form the first deck 160. The substrate 101 can be any suitable substrate, and can be processed with various suitable features. In an embodiment, the substrate 101 is formed of any suitable semiconductor material, such as silicon (Si), germanium (Ge), SiGe, a compound semiconductor, an alloy semiconductor, and the like. In another embodiment, the substrate 101 includes various layers, including conductive or insulating layers formed on a semiconductor substrate. In an example, the substrate 101 is a silicon-on-insulator (SOI) substrate. In an embodiment, the substrate 101 includes an epitaxial layer formed on insulator. In an embodiment, the substrate 101 includes various doping configurations depending on design requirements.

The first sub strings 111 are manufactured using a variety of semiconductor processing techniques, such as photolithography, chemical vapor deposition (CVD), physical vapor deposition (PVD), atomic layer deposition (ALD), dry etching, wet etching, chemical mechanical planarization (CMP), ion implantation, and the like.

Referring to FIG. 2, the first gate dielectric structure 137 can include multiple dielectric layers, such as the tunnel insulating layer 134, the charge storage layer 135, and the blocking insulating layer 136 that are sequentially stacked over the first channel layer 133. Each of the tunnel insulating layer 134, the charge storage layer 135, and the blocking insulating layer 136 can include one or more sublayers of dielectric materials. In some examples, the blocking insulating layer 136 includes a layer of $SiO_2$, the charge storage layer 135 includes a multi-sublayer configuration of SiN and SiON, the tunnel insulating layer 134 includes a multi-sublayer configuration of $SiO_2$ and SiON.

The first channel layer 133 can include polysilicon deposited via CVD, such as low pressure CVD. In some embodiments, the first contact 131 can include silicon deposited via a selective epitaxially growth technique. In an example, the first contact 131 includes monocrystalline Si. The first insulating layer 132 can be formed, for example, using ALD over the first channel layer 133. The first insulating layer 132 can include $SiO_2$ and the like.

In some embodiments, sacrificial layers (not shown), such as layers including silicon nitride are formed in place of the first gate structures 153d-153h shown in FIG. 2. The sacrificial layers are removed and replaced with the first gate structures 153d-153h in subsequent steps, for example, after forming the second channel structure 265. In an example, when the sacrificial layer in place of the first gate structure 153h is removed, an oxide layer (that is, the dielectric layer between the first contact 131 and the first gate structure 153h described in reference to FIG. 1) can be formed over the first contact 131 by an oxidation process. For example, the oxide layer can include silicon oxide. In some embodiments, the first gate structures 153d-153h are directly formed. Each of the first gate structures 153d-153h can include a high K layer and a metal layer. In an example, the high K layer can include aluminum oxide, and the metal layer can include W.

The insulating layers 155-157 can electrically insulate the first gate structures 153d-153h from each other and other components in the semiconductor device 100. The insulating layers 155-157 can include any suitable insulating materials, such as silicon oxide.

Figure 3:
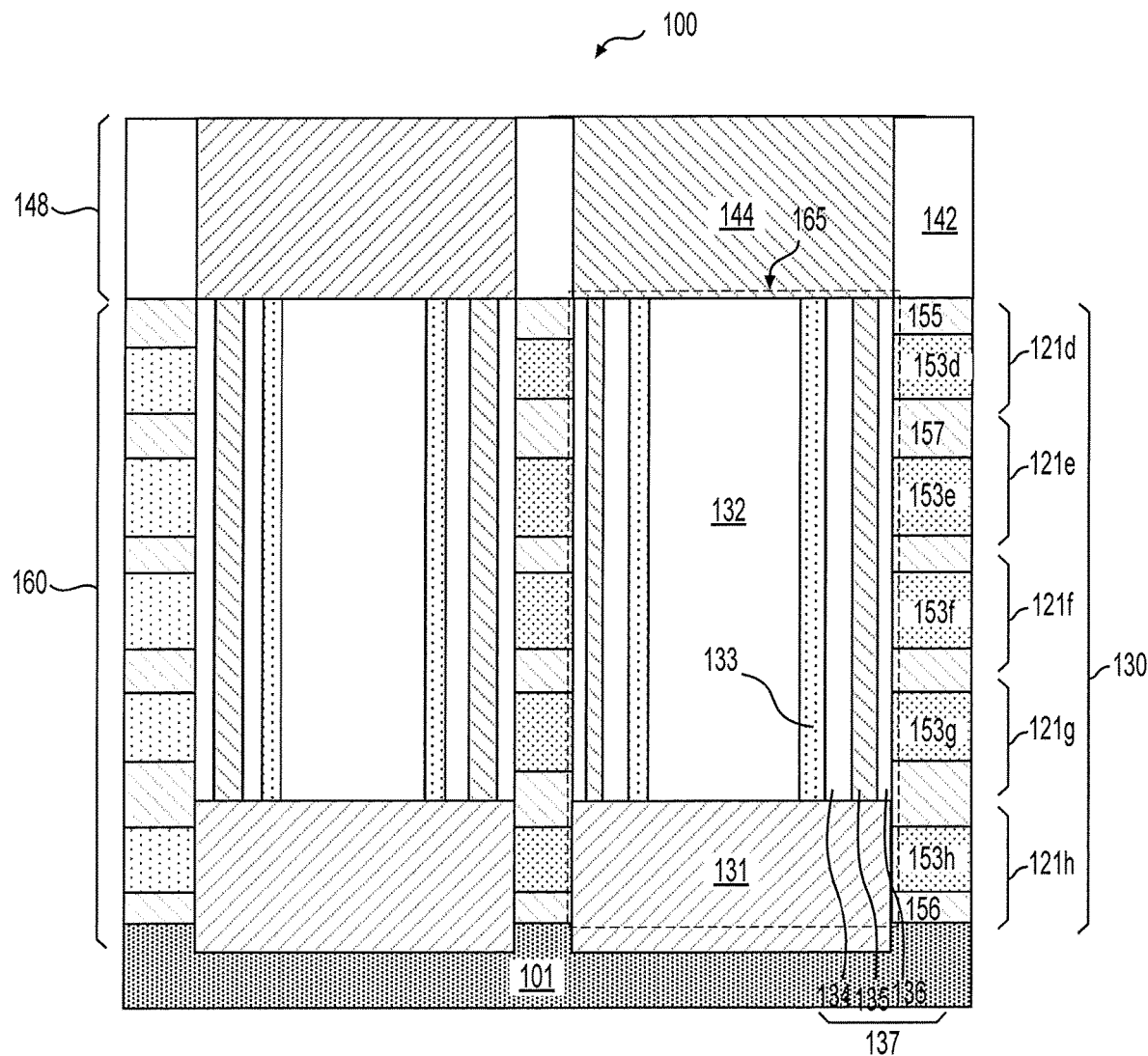

Referring to FIGS. 3 and 14, the process 1400 proceeds to S1420. At S1420, the first structure 144 of the channel connector 140 is formed above the first substring 111. In some embodiments, the insulating layer 142 is formed over the first substrings 111. For example, the insulating layer 142 includes silicon oxide, silicon oxynitride, silicon nitride, and the like. An opening (not shown) can be patterned in the insulating layer 142, and the opening can have a bottom portion that exposes the first channel structure 165. The first structure 144 can be formed, for example, by depositing polysilicon using a low pressure CVD process over the first channel structure 165. In an example, the first structure 144 is an intrinsic layer of polysilicon. The first structure 144 can electrically couple with the first channel layer 133. The first structure 144 can cover a top surface of the dielectric layer 142. A subsequent surface planarization process, such as a CMP, is performed to remove excessive polysilicon layer over the top surface of the dielectric layer 142. In an example, a thickness of the first structure 144 and the insulating layer 142 ranges from 1 to 2 microns.

Figure 4:
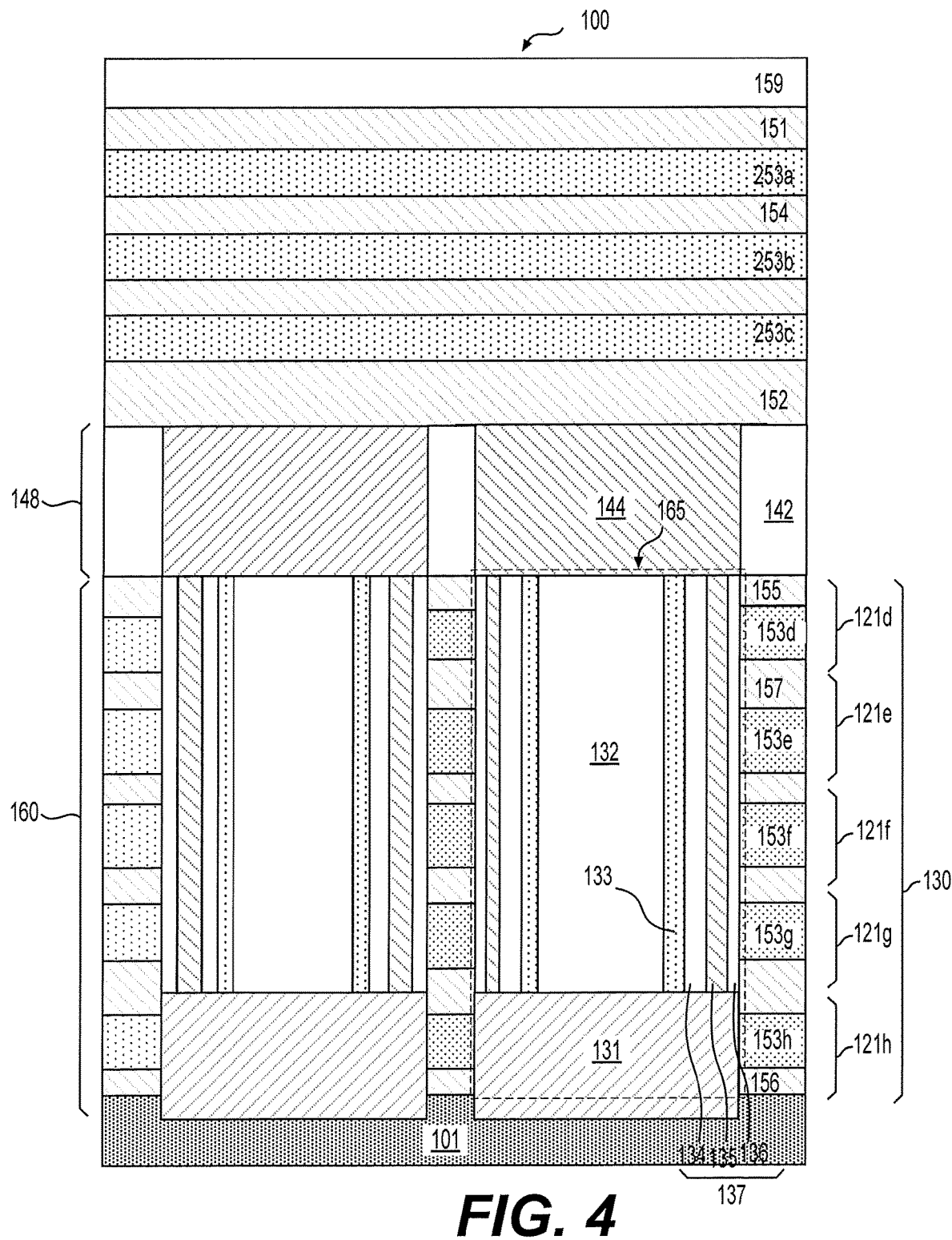

Referring to FIGS. 4 and 14, at S1430, a stack for the second substring 230 is formed over the first structure 144. The lower insulating layer 152 is formed on the first structure 144. The second sacrificial layers 253a-253c and the second insulating layers 154 are alternately formed on the lower insulating layer 152. In addition, the upper insulating layer 151 is formed over the second sacrificial layer 253a. In an example, the second sacrificial layers 253a-253c are formed by using silicon nitride. In an example, the lower insulating layer 152, the upper insulating layer 151, and the second insulating layer 154 are formed by using a dielectric material, such as silicon oxide ($SiO_2$), that has a different etch rate from that of the second sacrificial layers 253a-253c.

In an example, the number of second sacrificial layers may vary according to the number of word lines and the number of first selection lines in the second substring 230. Thicknesses of the second sacrificial layers 253a-253c can be different from or identical to each other. In an example, the thicknesses of the second sacrificial layers 253a-253c range from 20 to 50 nm. In an example, the thickness of the second sacrificial layers 253a-253c is about 35 nm. Any suitable deposition process, such as CVD, PVD, ALD, or any combination thereof, can be applied to form the second sacrificial layers 253a-253c. The insulating layers 151, 152, and 154 can have any suitable thicknesses, such as between 20 and 40 nm, and can be formed by performing CVD, PVD, ALD, or any combination thereof. In an example, the thickness of the insulating layers 154 is 25 nm.

In the example shown in FIG. 4, a mask layer 159 is formed and patterned over the upper insulating layer 151 to protect the semiconductor device 100 during subsequent processing. The mask layer 159 can include one or more hard mask sublayers, such as silicon nitride and silicon oxide.

Figure 5:
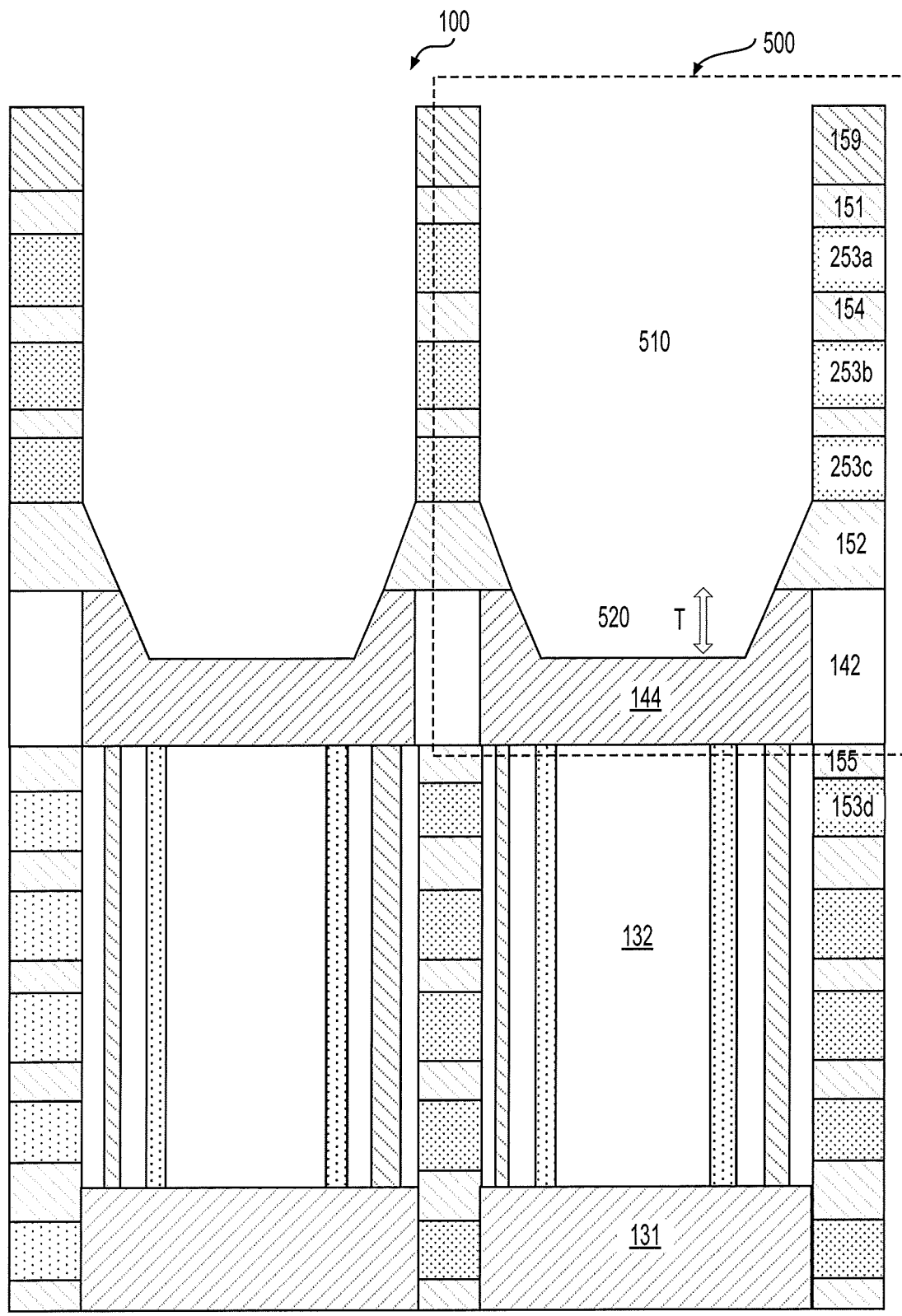

In various embodiments, the mask layer 159 can be patterned according to any suitable techniques, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like. Referring to FIGS. 5 and 14, at S1440, a channel opening 510 extending into the first structure 144 is formed using the mask layer 159. Portions of the second sacrificial layers 253a-253c, the upper insulating layer 151, the second insulating layer 154, the lower insulating layer 152, and the first structure 144, exposed by the patterned mask layer 159, are removed to form the channel opening 510. In an embodiment, the channel opening 510 is formed using an etching process, such as a wet etching, a dry etching, or a combination thereof.

The channel opening 510 includes a recessed region 520 formed by removing a top portion of the first structure 144. The recessed region 520 can have any suitable depth T based on design and fabrication considerations. In an example, the depth T ranges from 10 to 60 nanometers (nm). In an example, the depth T is about 40 nm. The channel opening 510 can have any suitable shape, such as a circular pillar-shape, a square pillar-shape, an oval pillar-shape, or any other suitable shapes. In an example, a top critical dimension (CD) of the channel opening 510 can range from 120 to 150 nm and a bottom CD can range from 50 to 70 nm, and the channel opening 510 can have a tapered profile where the bottom CD is smaller than the top CD. The tapered profile can be obtained by tapering a mask profile of the patterned mask layer 159, adjusting parameters of the etching process, and the like. A tapered profile can help subsequent deposition steps and improve sidewall coverage. In some examples, a subsequent plasma ashing and a wet clean can be applied to remove the remaining mask layer 159. In some examples, a portion of the mask layer 159, such as the one or more hard mask sublayers remain to protect the semiconductor device 100 during subsequent processing. For purposes of clarity, subsequent description is made based on the channel opening 510 in a region 500 in FIG. 5. The description is applicable to other channel openings in the semiconductor device 100. Note that the substrate 101 is not shown in FIG. 5.

Figure 6:
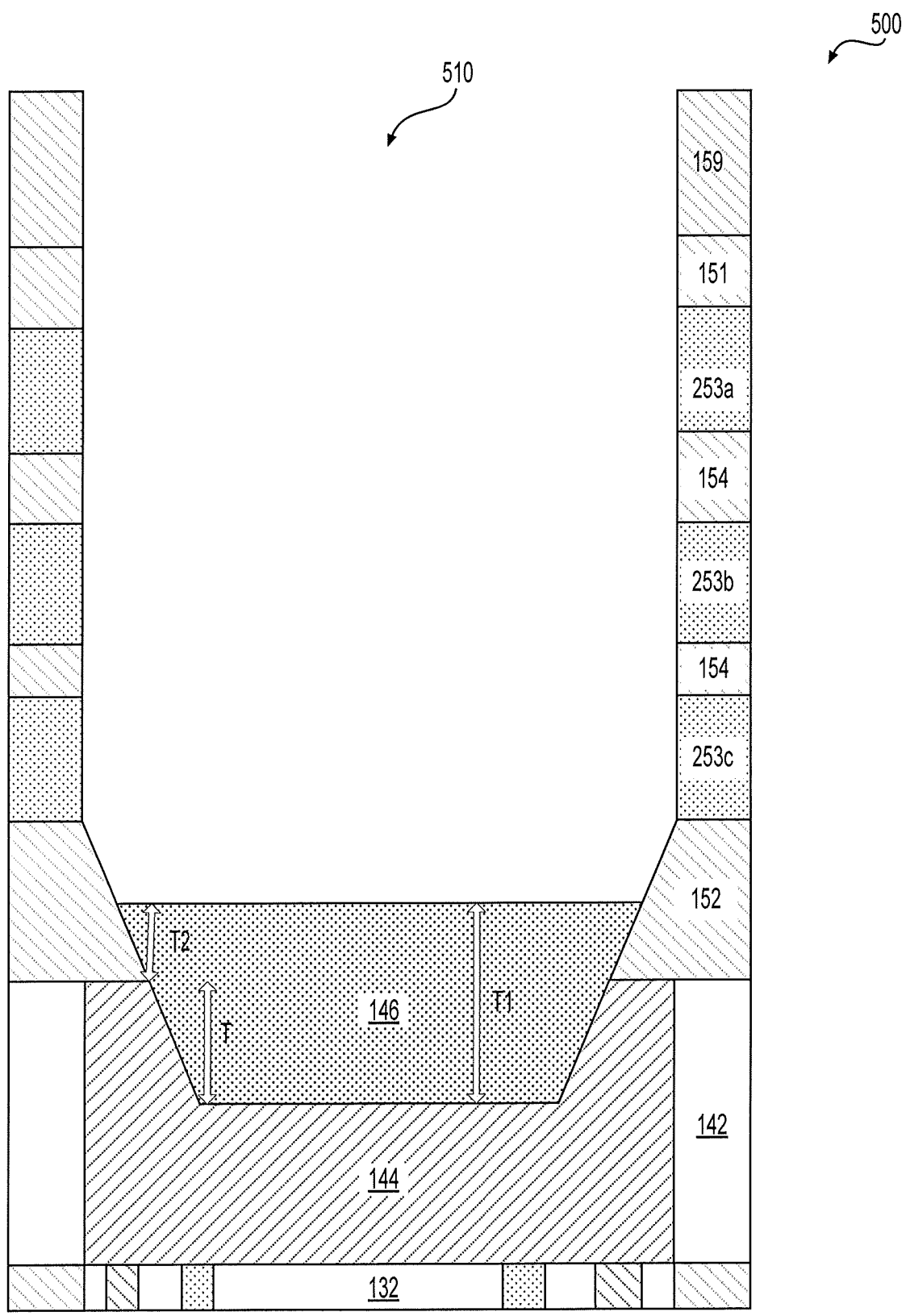

Referring to FIGS. 6 and 14, at S1450, the second structure 146 of the channel connector 140 is formed over the first structure 144. The second structure 146 can include any suitable material that can electrically couple the first and second channel layer 133 and 233 and can be formed using any suitable technologies. In some examples, the second structure 146 is formed based on the first structure 144. For example, the first structure 144 is formed with polysilicon. A pre-cleaning process is performed to remove, for example, native oxide and other impurities from a top surface of the first structure 144. The pre-cleaning process can include an etching process, such as a wet etching process. Subsequently, the second structure 146 is formed using an epitaxy process with the cleaned top surface of the first structure 144 acting as a seed layer. Accordingly, the second structure 146 is also referred to as an epitaxy layer 146.

Note that the second structure 146 overfills the recessed region 520 in order to prevent the second gate dielectric structure 237 (formed in subsequent steps) from forming within the recessed region 520. In some examples, a thickness T1 of the second structure 146 can range from 10 to 70 nm, and a top surface of the second structure 146 is 10-30 nm above a top surface of the first structure 144 and the recessed region 520. As a result, the second structure 146 overfills the recessed region 520 by a thickness T2 ranging from 10 to 30 nm. Further, the top surface of the second structure 146 is below a bottom surface of the second sacrificial layer 253c, for example, to prevent electric shorting of the channel connector 140 and the second gate structure 153c. In various embodiments, the second structure 146 includes polysilicon.

Figure 7:
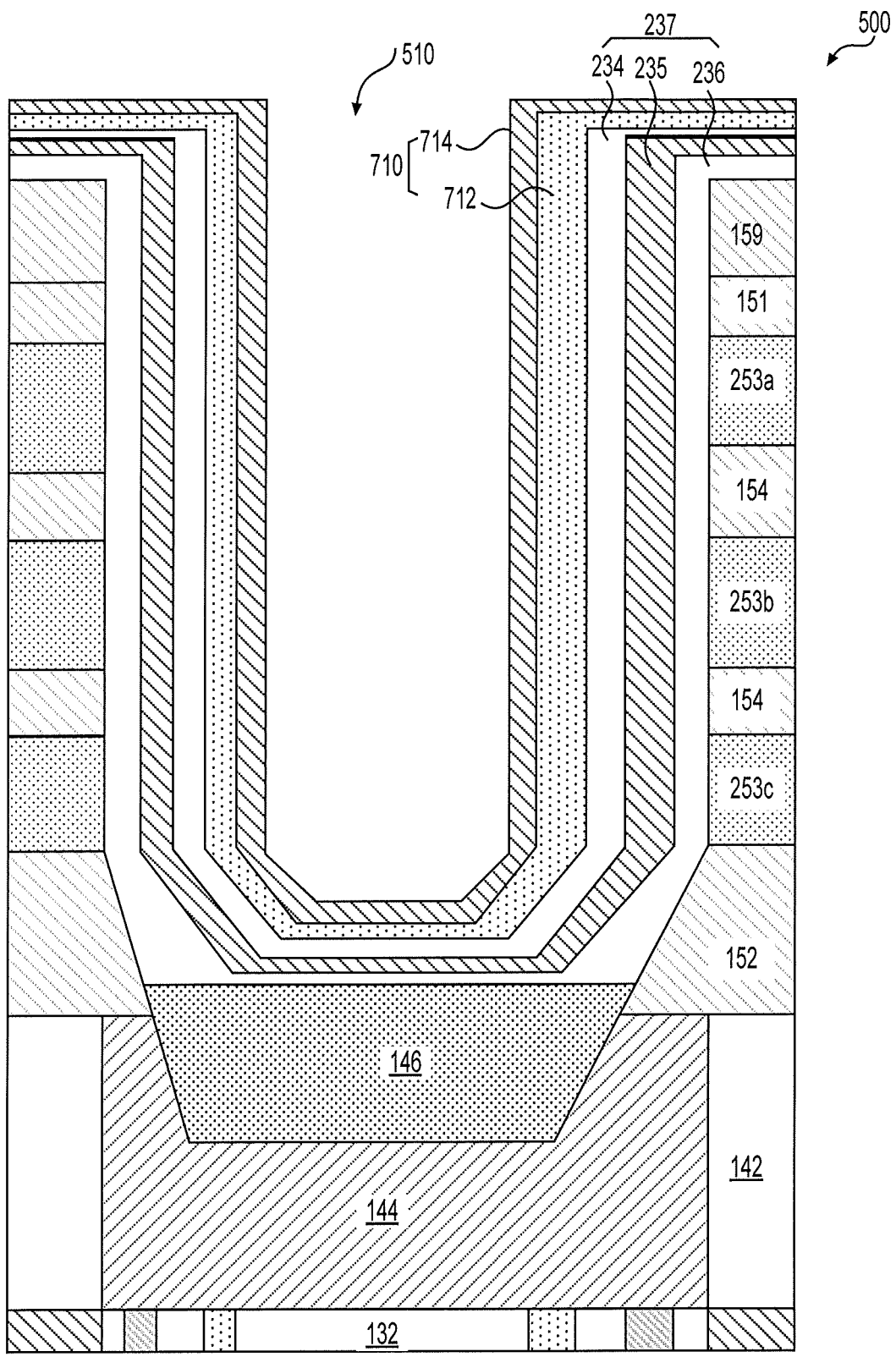

Referring to FIGS. 7 and 14, at S1460, the second gate dielectric structure 237 and one or more sacrificial layers 710 are formed in the channel opening 510. The second gate dielectric structure 237 can be conformably formed by sequentially depositing the blocking insulating layer 236, the charge storage layer 235, and the tunneling insulating layer 234 over the top surface of the second structure 146 and the sidewalls of the channel opening 510. Note that the tapered profile of the channel opening 510 can improve coverage of the sidewalls. In an embodiment, each of the blocking insulating layers 236, the charge storage layer 235, and the tunneling insulating layer 234 can be formed using any suitable process, such as an ALD process, a CVD process, a PVD process, or a combination thereof. For example, the tunneling insulating layer 234 can be formed of $SiO_2$, $Si_3N_4$, SiON, $HfO_2$, $Al_2O_3$, and the like. The tunnel insulating layer 234 can have a thickness from 1 to 5 nm based on design requirements. The charge storage layer 235 can be formed of silicon nitride, and may also include quantum dots or nanocrystals. A thickness of the charge storage layer 235 can range from 3 to 10 nm based on technology requirements. The blocking insulating layer 236 with a thickness ranging between 1 and 10 nm can include $SiO_2$, $HfO_2$, $ZrO_2$, $Al_2O_3$, tantalum oxide, a combination thereof, and the like. In an example, the blocking insulating layer 236 includes $SiO_2$ formed by oxidizing a pre-formed silicon nitride layer via an in situ steam generation (ISSG) process, the charge storage layer 235 includes a multi-layer configuration formed by silicon nitride and silicon oxynitride, and the tunneling insulating layer 234 includes a multi-layer configuration formed by silicon oxide and silicon oxynitride. In an example, a thickness of the second gate dielectric structure 237 can range from 15 to 25 nm according to design requirements.

The one or more sacrificial layers 710 are formed to protect the semiconductor device 100, such as the second gate dielectric structure 237, in subsequent processing steps. In an example, the one or more sacrificial layers 710 include a first polysilicon layer 712 and a cap oxide layer 714. Any suitable manufacturing process can be applied to form the one or more sacrificial layers 710, such as CVD, PVD, ALD, or any combination thereof. In an embodiment, the first polysilicon layer 712 having a thickness ranging from 3.5 to 5 nm is formed using a CVD process, such as a low pressure CVD process, a furnace CVD process, and the like. In an embodiment, the cap oxide layer 714 having a thickness ranging from 3 to 5 nm is formed using an ALD process.

Figure 8:
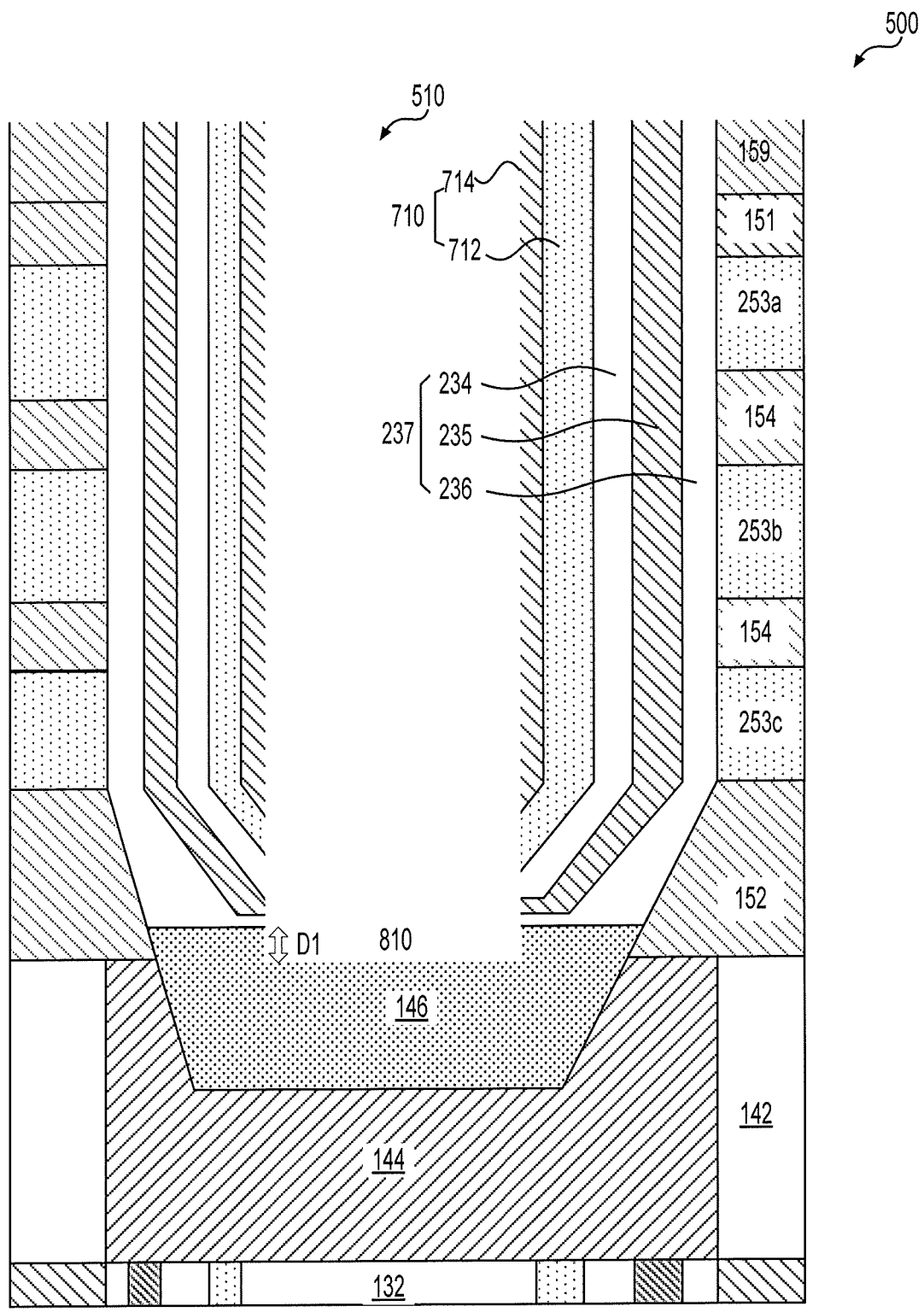

Referring to FIGS. 8 and 14, at S1470, a top region 810 of the second structure 146 is removed, for example, using an etching process to facilitate electrical coupling of the second channel layer 233 and the channel connector 140 via the top region 810 in the second structure 146. In an example, a recessed depth D1 of the top region 810 ranges from 10 to 20 nm. The one or more sacrificial layers 710 protect the second gate dielectric structure 237 during the etching process. The one or more sacrificial layers 710 along the sidewalls of the channel opening 510, such as the cap oxide layer 714, can be partially removed. The mask layer 159 may also be partially removed. In an embodiment, the etching process is a dry etching process, such as a plasma etch referred to as a plasma punch. In an example, a polymer layer is deposited over the mask layer 159 during the etching process to further protect the semiconductor device 100.

Figure 9:
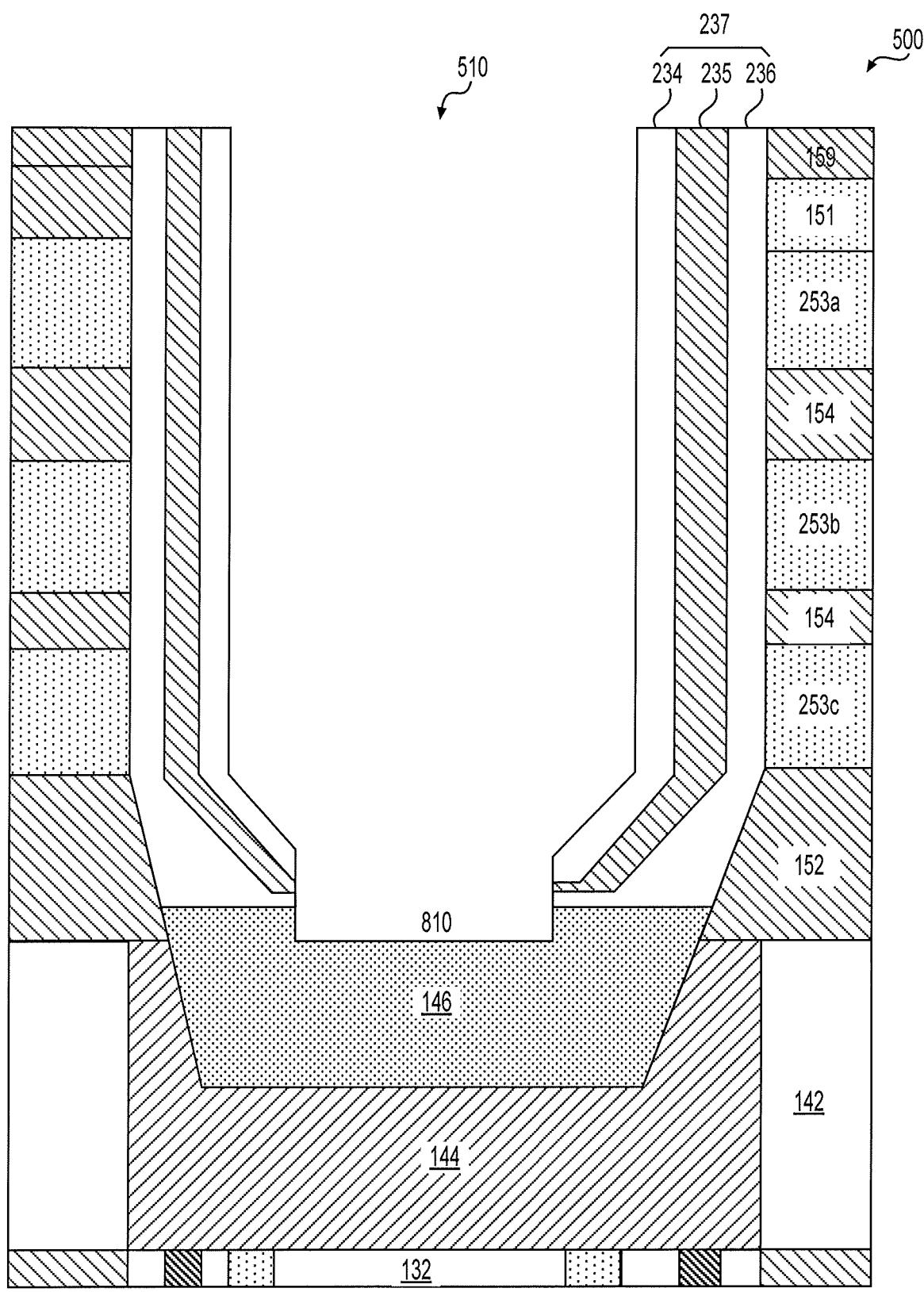

Referring to FIGS. 9 and 14, at S1480, the one or more sacrificial layers 710 are removed, for example, using an etching process. In an embodiment, the etching process includes a wet etch using a mixed solution including ammonia and hydrofluoric acid to remove the remaining cap oxide layer 714 and the first polysilicon layer 712 from the sidewalls of the channel opening 510. In an example, the etching process is controlled to selectively remove the one or more sacrificial layers 710 and minimally affect the second structure 146 and the second gate dielectric structure 237.

Figure 10:
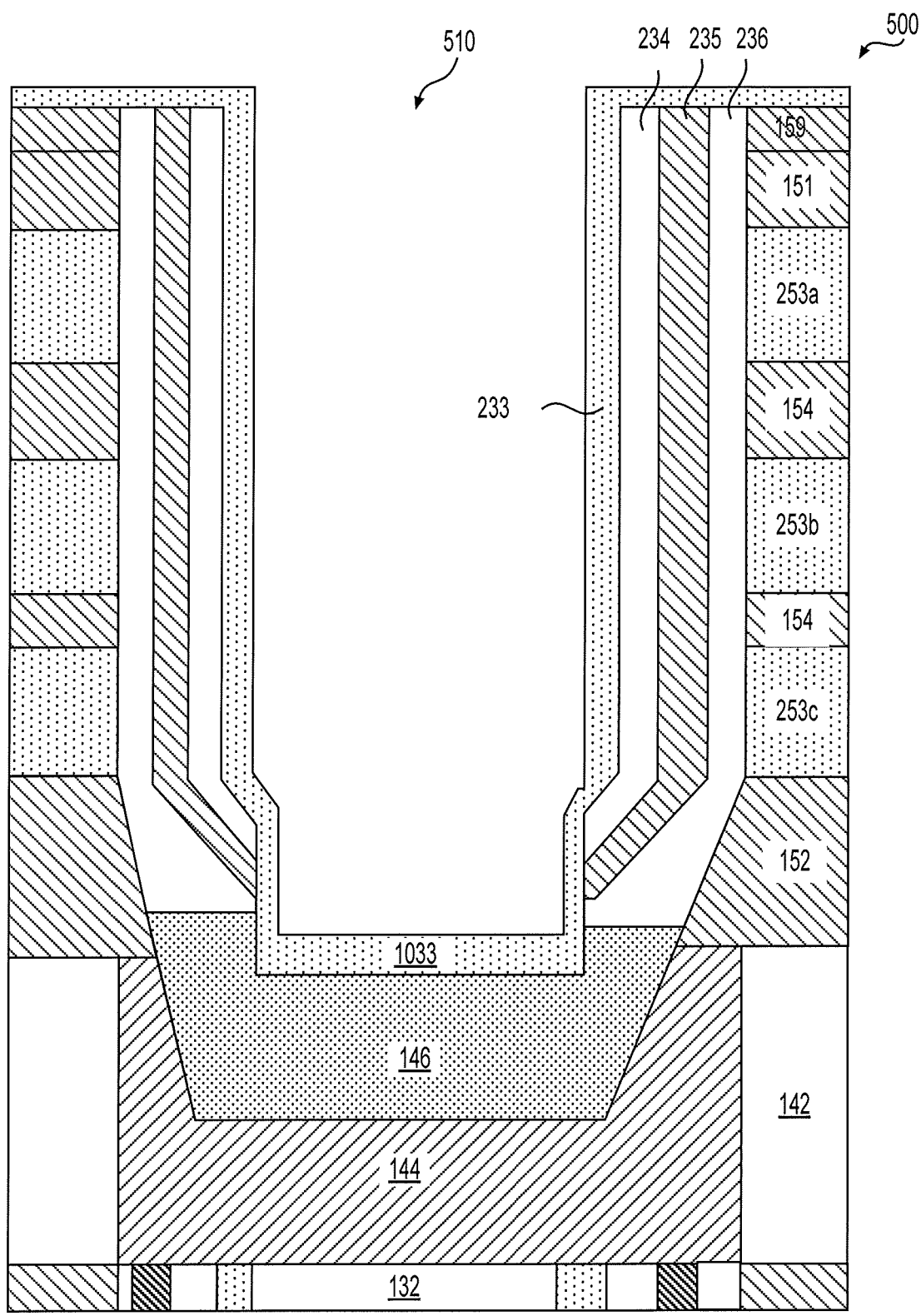

Referring to FIGS. 10 and 14, at S1490, one or more semiconductor materials are deposited over the second structure 146 and on the sidewalls of the channel opening 510. Accordingly, the second channel layer 233 is formed over the sidewalls of the channel opening 510, and a contact 1033 between the second channel layer 233 and the channel connector 140 is formed over the top surface of the second structure 146.

The one or more semiconductor materials can include intrinsic polysilicon, polysilicon doped with impurities, and the like. In an example, the one or more semiconductor material includes a polysilicon layer deposited using a low pressure CVD process. Other suitable deposition process can also be applied to form the second channel layer 233 and the contact 1033, such as PVD, ALD, or any combination thereof. In some examples, the second channel layer 233 can be conformably formed on the sidewalls of the tunnel insulation layer 234 to have a predetermined thickness between 3 and 5 nm. In an example, the second channel layer 233 is further annealed, for example, to improve quality of the polysilicon layer. The one or more semiconductor materials can cover a top surface of the region 500.

Figure 11:
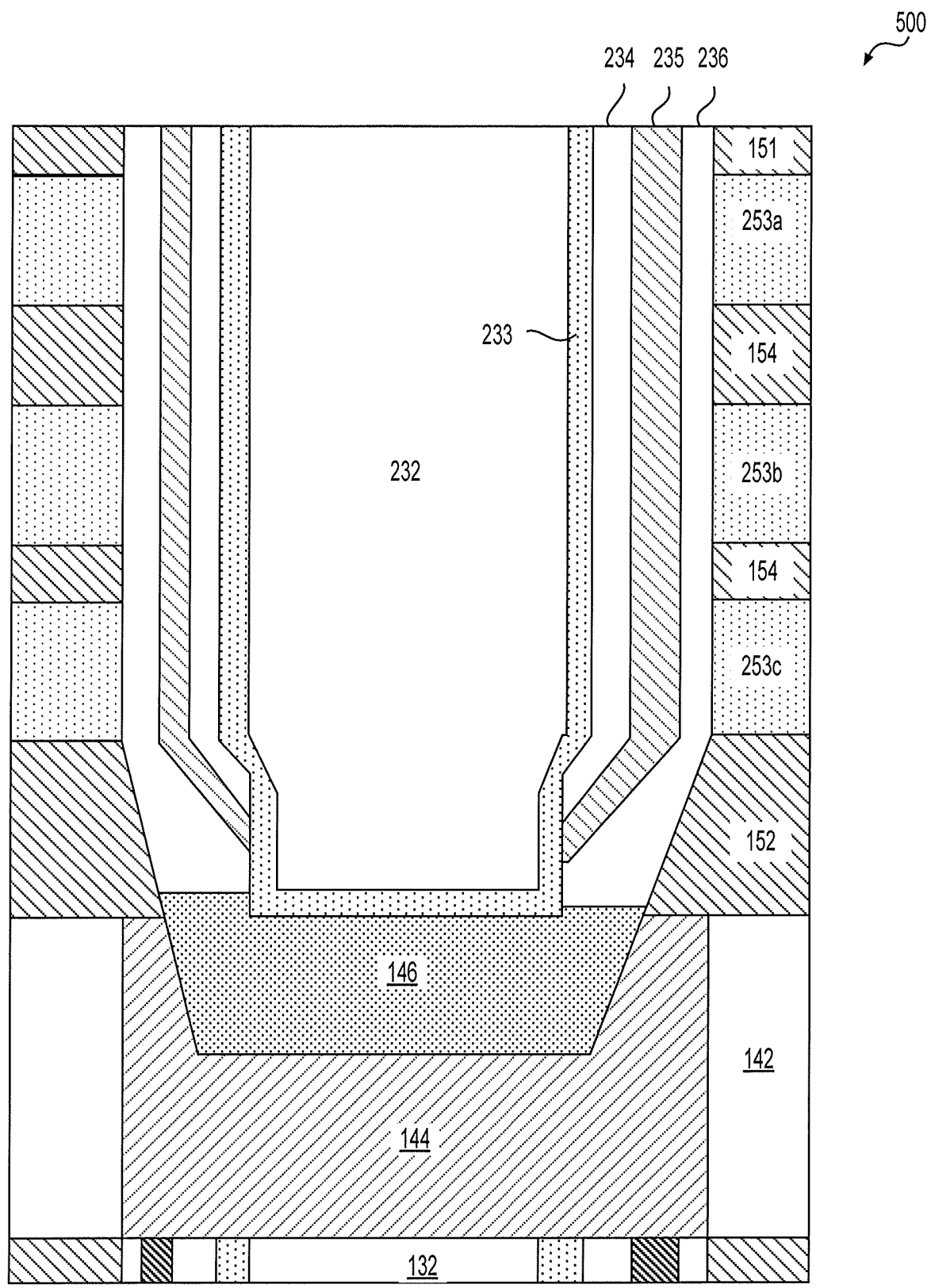

Referring to FIGS. 11 and 14, at S1492, the second insulating layer 232 is formed over the second channel layer 233. The second insulation layer 232 can further cover the top surface of the region 500. The second insulating layer 232 can fill the remaining channel opening 510 including an internal empty or unobstructed space of the channel opening 510. The second insulating layer 232 can include one or more insulating materials, such as $SiO_2$, SiN, SiON, SiOCN, and the like. The second insulation layer 232 can be formed by performing one or a combination of CVD, PVD, ALD, and the like. In an example, the second insulation layer 232 can be formed by depositing silicon oxide using ALD. In an example, a surface planarization process such as CMP can be performed to remove any excessive semiconductor materials deposited over the top surface of the region 500 at S1490 and any excessive second insulation layer 232 over the top surface of the region 500. Top surfaces of the second insulation layer 232, the second channel layer 233, the second gate dielectric structure 237, and the upper insulation layer 151 are then coplanar.

In some examples, the second substring 230 is an uppermost substring in the string 111. Referring to FIGS. 12 to 14, at S1495, the second contact 231 is formed. Referring to FIG. 12, a top portion of the second insulating layer 232 is recessed by a photolithography patterning process and a subsequent etching process. A contact layer 1210 is subsequently formed to fill the recessed top portion of the second insulating layer 232. The contact layer 1210 can further cover the top surface of the upper insulating layer 151. The contact layer 1210 can include polysilicon, or other suitable materials, for example, to electrically couple the string 111 to a bit line. The contact layer 1210 can be formed by performing one or a combination of CVD, PVD, ALD, and the like.

Referring to FIG. 13, a surface planarization process (e.g., CMP) can be applied to remove any excessive contact layer 1210 over the top surface of the upper insulating layer 151. When the surface planarization process is completed, the contact layer 1210 that remains in the recessed top portion of the second insulating layer 232 forms the second contact 231. The second contact 231 can be electrically connected with a bit line thereafter.

In some embodiments, one or more substrings are formed above the second substring 230 to form the substring 111. Therefore, steps S1420-S1492 can be repeated a suitable number of times to manufacture the one or more substrings above the second substring 230 while not forming second contact 231. Further, the step S1495 can be used to manufacture the second contact 231 over an uppermost substring in the string 111.

In subsequent processing steps, the second sacrificial layers 253a-253c can be removed and replaced with the suitable gate structures 153a-153c. In addition, the first sacrificial layer 253d-253h can also be removed and replaced with the suitable gate structures 153d-153h. In some examples, each gate structure includes a high K layer such as aluminum oxide and a metal layer such as W, as described above.

In an example, the string 111 includes the first substring 130, the channel connector 140, and the second sub string 230. In an example, each substring includes 64 memory cells. Accordingly, the semiconductor device 100 includes the first deck 160, the inter-deck structure 148, and the second deck 260. Each of the first deck 160 and the second deck 260 has 64 layers of memory cells. A thickness of the first deck 160, the inter-deck structure 148, and the second deck 260 can range from 8 to 10 microns.

Note that additional steps can be provided before, during, and after the process 1400, and one or more of the steps described above can be replaced, eliminated, adapted, and/or performed in different order for additional embodiments of the process 1400. In subsequent process steps, various additional interconnect structures (e.g., metallization layers having conductive lines and/or vias) may be formed over the semiconductor device 100. Such interconnect structure electrically connect the semiconductor device 100 with other contact structures and/or active devices to form functional circuits. Additional device features such as passivation layers, input/output structures, and the like may also be formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a string of transistors stacked along a vertical direction above a substrate of the semiconductor device, the string comprising:
   a first substring of transistors having a first channel structure that includes a first channel layer and a first gate dielectric structure that extend along the vertical direction;
   a channel connector disposed above the first sub string; and
   a second substring of transistors stacked above the channel connector, the second substring having a second channel structure that includes a second channel layer and a second gate dielectric structure that extend along the vertical direction, the channel connector electrically coupling the first channel layer and the second channel layer and being disposed below the second gate dielectric structure, wherein
   the channel connector includes a first structure and a second structure,
   the first structure includes a first recessed region that is overfilled by the second structure,
   the second structure includes a second recessed region, and
   the second channel layer extends into the second recessed region and contacts sidewalls of the second recessed region and a surface of the second recessed region is fully covered by a contact that is connected to the second channel layer, the contact electrically coupling the second channel layer and the second structure.

2. The semiconductor device according to claim 1, wherein the second gate dielectric structure includes a tunnel insulating layer, a charge storage layer, and a blocking insulating layer that are sequentially formed over the second channel layer.

3. The semiconductor device according to claim 1, wherein
the first structure is in contact with the first channel layer and has a first upper surface with the first recessed region; and
the second structure is in contact with the second channel layer and has a second upper surface with the second recessed region, the second gate dielectric structure being disposed on the second upper surface, the second upper surface being above the first upper surface.

4. The semiconductor device according to claim 1, wherein
the second recessed region is formed in an upper surface of the channel connector; and
the second gate dielectric structure is disposed on the upper surface.

5. The semiconductor device according to claim 1, wherein the second structure is in contact with the second channel structure, and the second structure is formed of an epitaxially grown material.

6. The semiconductor device according to claim 1, wherein the channel connector includes polysilicon.

7. The semiconductor device according to claim 1, wherein:
the second channel layer and the contact are made of an identical material.

8. The semiconductor device according to claim 1, wherein
the first structure is separated from the second gate dielectric structure, and
the second structure is disposed adjacent to and below the second gate dielectric structure.

9. The semiconductor device according to claim 8, wherein the first structure is adjacent to the first channel layer, the second structure is adjacent to the second channel layer, and a channel layer of the string includes the first channel layer and the second channel layer electrically coupled by the channel connector.

10. A semiconductor memory device, comprising:
a first deck of memory cells including a plurality of first substrings of memory cells over a substrate of the semiconductor memory device, the first substrings having respective first channel structures that include first channel layers and first gate dielectric structures that extend along a vertical direction above the substrate;
an inter-deck structure including a plurality of channel connectors, the channel connectors being disposed above respective first substrings of the plurality of first sub strings; and
a second deck of memory cells including a plurality of second substrings of memory cells, the second substrings being stacked above respective channel connectors of the plurality of channel connectors and having respective second channel structures that include second channel layers and second gate dielectric structures that extend along the vertical direction, the channel connectors electrically coupling the respective first channel layers and the second channel layers and being disposed below the respective second gate dielectric structures, wherein
the channel connectors include respective first structures and second structures,
the first structures include first recessed regions that are overfilled by the respective second structures,
the second structures include respective second recessed regions, and
the second channel layers extend into the respective second recessed regions and contact sidewalls of the respective second recessed regions and respective surfaces of the second recessed regions are fully covered by contacts that are connected to the respective second channel layers, the contacts electrically coupling the respective second channel layers and the respective second structures.

11. The semiconductor memory device according to claim 10, wherein the second gate dielectric structures are adjacent to and disposed above the second structures, and are separated from the first structures via the second structures.

12. The semiconductor memory device according to claim 10, wherein:
the first structures are in contact with the first channel layers and have first upper surfaces with the first recessed regions; and
the second structures are in contact with the second channel layers and have second upper surfaces with the second recessed regions.

13. The semiconductor memory device according to claim 10, wherein:
the second channel layers and the contacts are made of an identical material.

* * * * *